United States Patent
Dennison

(10) Patent No.: US 10,398,053 B2
(45) Date of Patent: Aug. 27, 2019

(54) EQUIPMENT CLAMPING ASSEMBLY HAVING HORIZONTAL AND VERTICAL CLAMPS FOR USE IN RUGGED AND OTHER ENVIRONMENTS

(71) Applicant: Raytheon Company, Waltham, MA (US)

(72) Inventor: Peter E. Dennison, Westminster, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/133,377

(22) Filed: Sep. 17, 2018

(65) Prior Publication Data

US 2019/0021183 A1    Jan. 17, 2019

Related U.S. Application Data

(63) Continuation of application No. 15/379,978, filed on Dec. 15, 2016, now Pat. No. 10,080,306.

(51) Int. Cl.
| | |
|---|---|
| *H05K 7/14* | (2006.01) |
| *A47B 88/43* | (2017.01) |
| *A47B 88/477* | (2017.01) |
| *H05K 7/18* | (2006.01) |

(52) U.S. Cl.
CPC ........... *H05K 7/1489* (2013.01); *A47B 88/43* (2017.01); *A47B 88/477* (2017.01); *H05K 7/183* (2013.01)

(58) Field of Classification Search
CPC ...... H05K 7/1489; H05K 7/183; A47B 88/43; A47B 88/477
See application file for complete search history.

(56) References Cited

U.S. PATENT DOCUMENTS

| | | | | |
|---|---|---|---|---|
| 6,467,858 | B1* | 10/2002 | Le | G06F 1/181 |
| | | | | 312/223.2 |
| 9,867,309 | B2* | 1/2018 | Su | H05K 7/1489 |
| 2014/0153183 | A1* | 6/2014 | Pofahl | G06F 1/20 |
| | | | | 361/679.46 |
| 2014/0299737 | A1* | 10/2014 | Okumura | H05K 5/0217 |
| | | | | 248/636 |
| 2015/0090677 | A1* | 4/2015 | Shao | H05K 7/1489 |
| | | | | 211/26 |
| 2015/0282377 | A1* | 10/2015 | Hilburn | H05K 7/1489 |
| | | | | 248/213.2 |
| 2016/0057887 | A1* | 2/2016 | Conn | H05K 7/183 |
| | | | | 361/679.58 |

(Continued)

*Primary Examiner* — Hanh V Tran

(57) ABSTRACT

An apparatus includes a clamping assembly configured to secure a component in or to a support structure. The clamping assembly includes a first side rail configured to be coupled to the support structure. The clamping assembly also includes first and second clamps each configured to slide along the first side rail. The first and second clamps are configured to apply first and second clamping forces to the component in different directions from one another. The clamping assembly may further include a second side rail configured to be coupled to the support structure and third and fourth clamps each configured to slide along the second side rail, where the third and fourth clamps are configured to apply third and fourth clamping forces to the component in different directions from one another.

20 Claims, 5 Drawing Sheets

(56) References Cited

U.S. PATENT DOCUMENTS

| | | | | |
|---|---|---|---|---|
| 2016/0150668 A1* | 5/2016 | Cheng | .................. | H05K 7/1489 |
| | | | | 361/679.02 |
| 2016/0278231 A1* | 9/2016 | Tsai | ..................... | H05K 7/1487 |
| 2017/0354051 A1* | 12/2017 | Franz | ................... | H05K 7/1489 |

* cited by examiner

EQUIPMENT CLAMPING ASSEMBLY HAVING HORIZONTAL AND VERTICAL CLAMPS FOR USE IN RUGGED AND OTHER ENVIRONMENTS

CROSS-REFERENCE TO RELATED APPLICATION AND PRIORITY CLAIM

This application is a continuation of U.S. patent application Ser. No. 15/379,978 filed on Dec. 15, 2016 (now U.S. Pat. No. 10,080,306). This application is hereby incorporated by reference in its entirety.

GOVERNMENT RIGHTS

This invention was made with U.S. government support under contract N00024-14-C-5315 awarded by the United States Navy. The U.S. government may have certain rights in this invention.

TECHNICAL FIELD

This disclosure generally relates to mounting assemblies for physically mounting equipment in cabinets or to other support structures. More specifically, this disclosure relates to an equipment clamping assembly having horizontal and vertical clamps for use in rugged and other environments.

BACKGROUND

Electronic equipment is routinely used in an operational environment by mounting the equipment in one or more cabinets. It is becoming more and more common to use commercial off-the-shelf (COTS) electronic equipment whenever possible since COTS equipment is typically less expensive and more readily available than specialized equipment. However, in rugged environments such as various commercial or military applications, electronic equipment could be subjected to severe shocks or vibrations. Unfortunately, standard COTS equipment is usually not designed to operate in rugged environments where severe shocks or vibrations are present. If not mitigated, these shocks or vibrations could damage or destroy the electronic equipment or even cause the electronic equipment to be forcibly ejected from a cabinet.

SUMMARY

This disclosure provides an equipment clamping assembly having horizontal and vertical clamps for use in rugged and other environments.

In a first embodiment, an apparatus includes a clamping assembly configured to secure a component in or to a support structure. The clamping assembly includes a first side rail configured to be coupled to the support structure. The clamping assembly also includes first and second clamps each configured to slide along the first side rail. The first and second clamps are configured to apply first and second clamping forces to the component in different directions from one another.

In a second embodiment, a system includes a cabinet and a clamping assembly configured to secure a piece of equipment in or to the cabinet. The clamping assembly includes a first side rail configured to be coupled to the cabinet. The clamping assembly also includes first and second clamps each configured to slide along the first side rail. The first and second clamps are configured to apply first and second clamping forces to the piece of equipment in different directions from one another.

In a third embodiment, a method includes coupling a side rail of a clamping assembly to a support structure. The method also includes sliding first and second clamps along the side rail. The method further includes applying first and second clamping forces to the component in different directions from one another as the first and second clamps move slide along the side rail.

Other technical features may be readily apparent to one skilled in the art from the following figures, descriptions, and claims.

BRIEF DESCRIPTION OF THE DRAWINGS

For a more complete understanding of this disclosure, reference is made to the following description, taken in conjunction with the accompanying drawings, in which.

DETAILED DESCRIPTION

FIGS. 1 through 6, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

Figure 1:
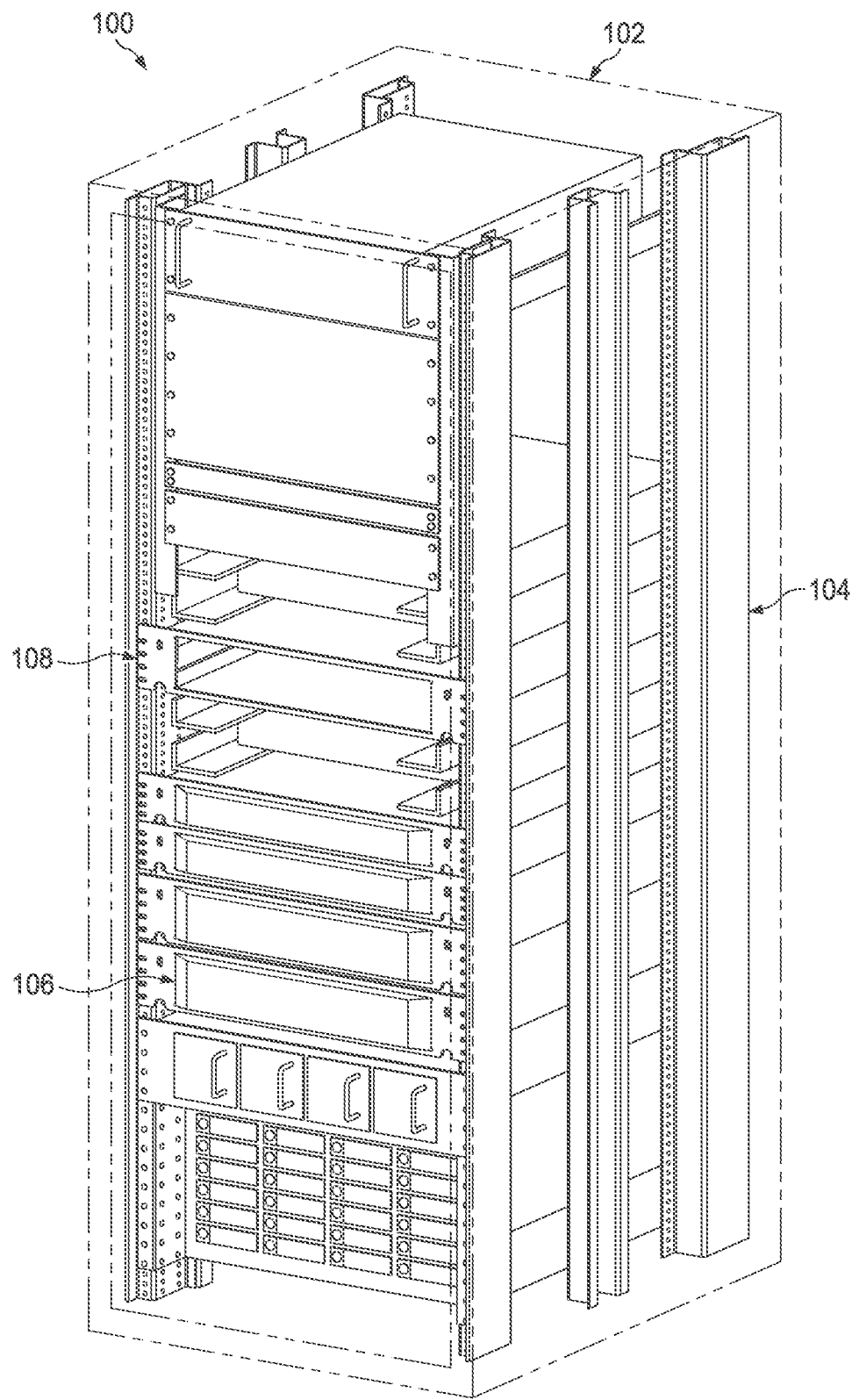
FIG. 1 illustrates an example system for mounting electronic equipment according to this disclosure.

FIG. 1 illustrates an example system 100 for mounting electronic equipment according to this disclosure. As shown in FIG. 1, the system 100 includes a cabinet 102. For ease of illustration and explanation, the outer panels or "skin" and optionally one or more doors of the cabinet 102 have been removed so that an interior of the cabinet 102 is visible in FIG. 1.

The cabinet 102 here includes a number of vertical rails 104, each of which includes a number of holes formed by machining or other suitable technique. The holes of the rails 104 are used to receive bolts or other connectors in order to attach equipment to the cabinet 102. The holes of the rails 104 typically have a specified size and are typically formed at a specified interval up and down along the rails 104. In some embodiments, the cabinet 102 is designed to receive equipment that complies with a standard specification, such as equipment that complies with the Electronic Industries Association (EIA) RS-310 specification. This specification or other specifications can define the standard size and spacing for the holes in the rails 104. While the cabinet 102 itself could be wider than a standard RS-310 cabinet, the cabinet 102 can be configured to receive equipment that is compliant with the RS-310 specification.

Multiple pieces of electronic equipment 106 can be installed in the cabinet 102. The electronic equipment 106 could denote any suitable equipment and can perform a wide variety of functions depending on the implementation. For example, some of the electronic equipment 106 could denote server computers or other computing devices that are programmed to process data or control various aspects of a vessel or other structure. Other electronic equipment 106 could include power supplies, power conditioners, and communications equipment. Each piece of electronic equipment 106 includes any suitable electronic circuitry and is configured to be mounted in a cabinet. In some embodiments, at least one piece of electronic equipment 106 could denote commercial off-the-shelf (COTS) equipment, although this need not be the case.

One or more clamping assemblies 108 are used to mount at least one piece of electronic equipment 106 in the cabinet 102. As described in more detail below, the clamping assemblies 108 can be used to hold electronic equipment in a cabinet 102 and are able to withstand large shock and vibration loads, which can occur in various rugged environments.

One problem in rugged military, commercial, or other environments is that electronic equipment 106 in a cabinet 102 can be subjected to severe shocks or vibrations. Without some form of mitigation, the shocks or vibrations can damage or destroy the electronic equipment 106. In some instances, the shocks or vibrations could even cause a piece of electronic equipment 106 to be forcibly ejected from a cabinet 102. Not only could this cause secondary damage to nearby equipment or structures, it could cause severe injury or death to nearby personnel.

The clamping assemblies 108 described in this patent document can help to secure electronic equipment 106 in one or more cabinets 102 in order to provide additional support to and protection for the electronic equipment 106. In some instances, a clamping assembly 108 is used with COTS equipment 106 so that the COTS equipment 106 can be used in military, severe commercial, or other environments where the COTS equipment 106 by itself traditionally could not be used. In particular embodiments, a clamping assembly 108 allows electronic equipment 106 to be used in severe shock and vibration environments as defined by the MIL-STD-810 standard.

Moreover, the clamping assemblies 108 described in this patent document may not allow the electronic equipment 106 to be back-driven when placed under load. Ordinarily, back-driving of a component could cause the component to loosen from a clamp over time, which is clearly undesirable. By helping to reduce or prevent back-driving of electronic equipment 106, the clamping assemblies 108 can reduce or prevent the electronic equipment 106 from loosening from the clamping assemblies 108 over time.

Further, the height of cabinet-mounted electronic equipment 106 is often measured in terms of a standard "rack unit" (RU), such as 1 RU, 2, RU, and so one. A clamping assembly 108 could be designed to receive electronic equipment of a particular height, and different clamping assemblies 108 could be designed to receive electronic equipment of different heights. As a result, the clamping assemblies 108 can be easily designed or modified for use with any suitable equipment.

In addition, the clamping assemblies 108 can provide a variable amount of clamping force depending on the electronic equipment 106, and the clamping assemblies 108 allow for easy installation, removal, and replacement of the electronic equipment 106. In some instances, personnel can easily install and remove the electronic equipment 106 from the clamping assemblies 108 without much effort. For example, the electronic equipment 106 could be inserted into or removed from the cabinet 102 through the front or the back of a clamping assembly 108, and personnel may only need to ensure that locking nuts or other connectors are attached to threaded rods (described below) of the clamping assemblies 108 to a specific torque value in order to obtain a desired level of clamping. This helps to increase the ease of use and maintenance of the electronic equipment 106 and the overall system 100.

Additional details regarding various clamping assemblies 108 are provided below. While those details may be provided with respect to use of the clamping assemblies 108 in the cabinet 102 of FIG. 1, the clamping assemblies 108 described in this patent document could be used in any suitable systems and with any suitable components to be secured to any suitable support structures.

Although FIG. 1 illustrates one example of a system 100 for mounting electronic equipment, various changes may be made to FIG. 1. For example, a system could include any number of cabinets 102, and each cabinet 102 could include any number of rails 104 or other structural components. Also, each cabinet 102 could be used to hold any number of pieces of electronic equipment 106. Further, one, some, or all of the pieces of electronic equipment 106 could use one or more clamping assemblies 108 when secured in at least one cabinet 102. In addition, while FIG. 1 illustrates one example system where one or more clamping assemblies 108 could be used, the clamping assemblies 108 described in this patent document could be used in any other suitable system.

Figure 3:
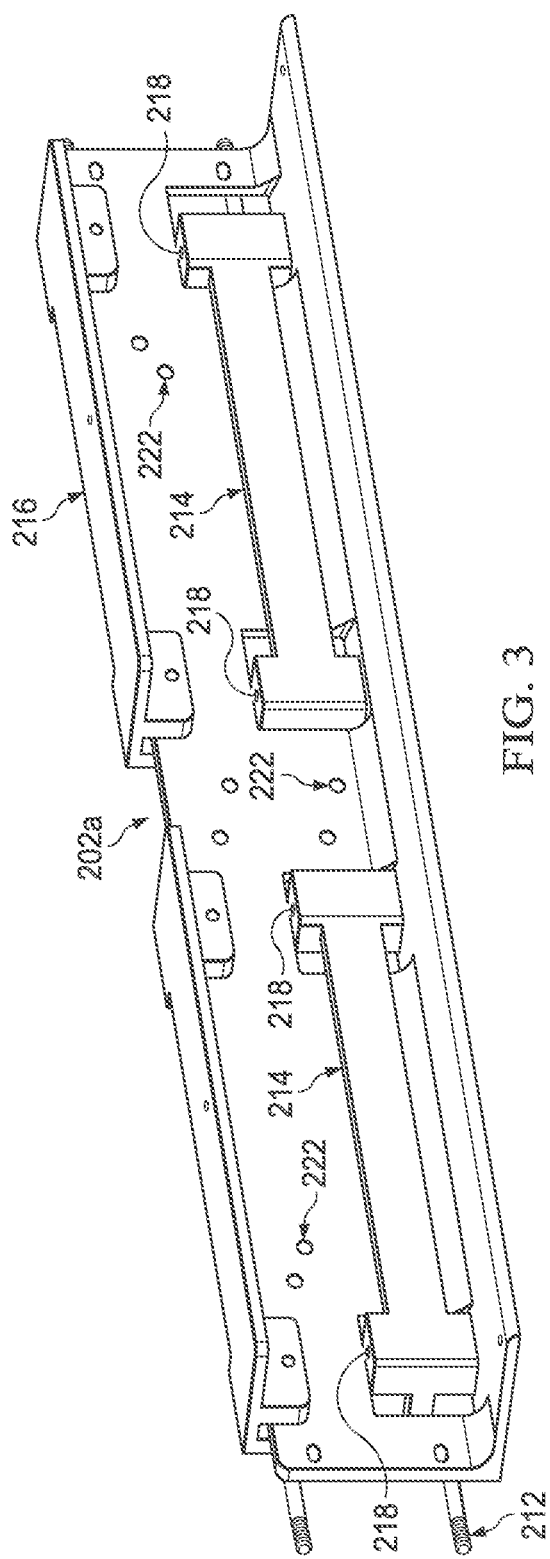
Figure 4:
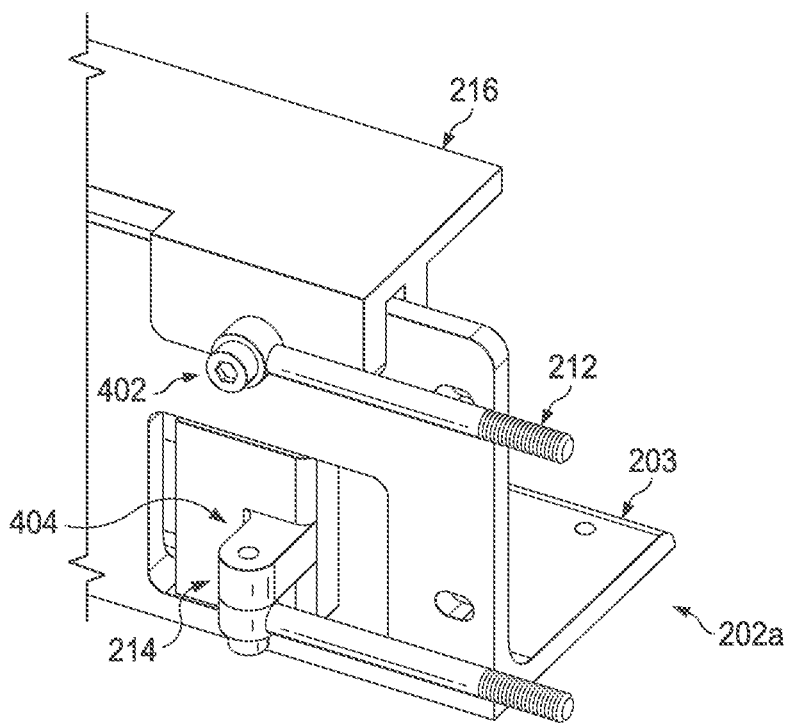
Figure 5:
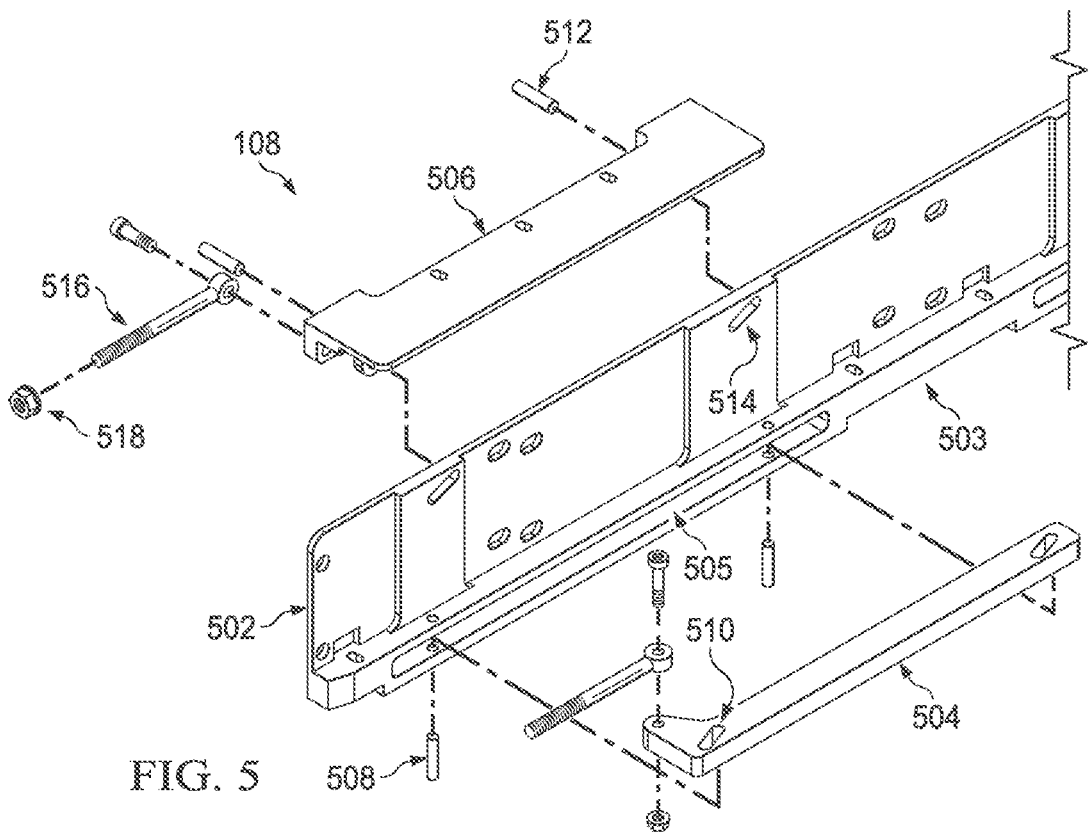

FIGS. 2A through 5 illustrate example clamping assemblies 108 for use with electronic equipment according to this disclosure. In particular, FIGS. 2A through 4 illustrate an example implementation of a clamping assembly 108, and FIG. 5 illustrates another example implementation of a clamping assembly 108.

Figure 2A:
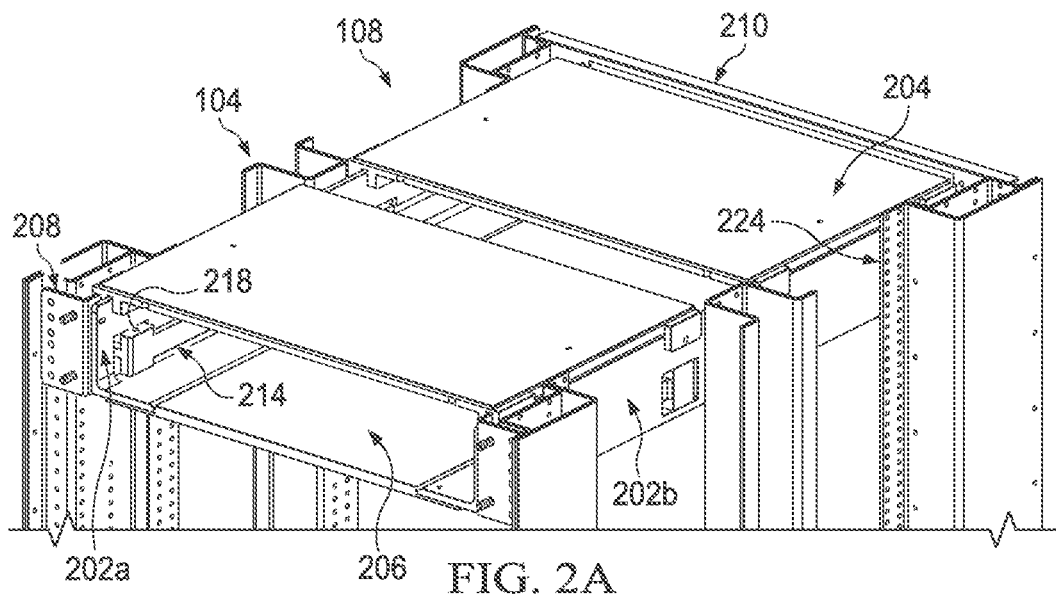
FIGS. 2A through 5 illustrate example clamping assemblies for use with electronic equipment according to this disclosure.

As shown in FIG. 2A, the clamping assembly 108 includes two side rails 202a-202b, one or more optional top plates 204, and one or more optional bottom plates 206. The side rails 202a-202b extend along most or all of the length of the clamping assembly 108 and are coupled to a cabinet 102 or other support structure (such as along opposite sides of the cabinet 102). The side rails 202a-202b contain or are coupled to various clamps, which are described below. The clamps are used to apply clamping forces on a piece of electronic equipment 106 inserted between the side rails 202a-202b. Each side rail 202a-202b includes a flange 203 that projects inward and on which the piece of electronic equipment 106 can be placed.

Each of the side rails 202a-202b could be formed from any suitable material(s) and in any suitable manner. For example, each of the side rails 202a-202b could be formed using steel or other metal. Also, various features could be formed in the metal using bending, stamping, machining, or other metal-working operations.

The top and bottom plates 204 and 206 provide structural reinforcement for a piece of electronic equipment 106 inserted into the clamping assembly 108. The top and bottom plates 204 and 206 could be formed from any suitable material(s) and in any suitable manner. For example, each of the plates 204 and 206 could be formed using steel or other metal, and various features could be formed in the metal using bending, stamping, machining, or other metal-working operations.

Mounting brackets 208 and/or a faceplate 210 can be used to secure the clamping assembly 108 to at least some of the rails 104 of a cabinet 102 or to another support structure. For example, the mounting brackets 208 and faceplate 210 can be secured to the rails 104 of the cabinet 102 using bolts or other connectors, and threaded rods 212 (described in more detail below) can extend from the side rails 202a-202b and be inserted through holes of the mounting brackets 208 and faceplate 210. Locking nuts or other connectors could then be secured to the ends of the threaded rods 212 and tightened to secure the side rails 202a-202b to the mounting brackets 208 and faceplate 210.

Each of the mounting brackets 208 and faceplate 210 could be formed from any suitable material(s) and in any suitable manner. For example, each of the mounting brackets 208 and faceplate 210 could be formed using steel or other metal, and various features could be formed in the metal using bending, stamping, machining, or other metal-working operations. Note that depending on the embodiment, however, the mounting brackets 208 or the faceplate 210 could be omitted from the clamping assembly 108 if not needed.

As shown in greater detail in FIGS. 3 and 4, the clamping assembly 108 includes at least one side clamp 214 and at least one top clamp 216. Each side clamp 214 can be pushed and pulled by an associated threaded rod 212 along the length of the clamping assembly 108. Pulling a side clamp 214 causes the side clamp 214 to move inward and apply clamping force on the electronic equipment 106 in a side-to-side direction, while pushing a side clamp 214 causes the side clamp 214 to move away from the electronic equipment 106. For example, a pin 218 can be inserted through a side clamp 214, and the pin 218 can project below the side clamp 214 into a cam slot 220 of a side rail 202a or 202b. In this example, each side clamp 214 includes two pins 218 that project into two cam slots 220, although other numbers of pins and cam slots could be used. The cam slots 220 are angled inward as the cam slots 220 extend towards the closer end of the clamping assembly 108. Thus, movement of the associated side clamp 214 towards the closer end of the clamping assembly 108 causes the side clamp 214 to physically move inward towards the electronic equipment 106. Various angles that are not parallel or perpendicular to the long axis of the side rail 202a or 202b could be used with the cam slots 220. In some embodiments, the cam slots 220 are angled between 16° and 18° with respect to the long axis of the side rail 202a or 202b, although other angles could be used.

Similarly, each top clamp 216 can be pushed and pulled by an associated threaded rod 212 along the length of the clamping assembly 108. Pulling a top clamp 216 causes the top clamp 216 to move downward and apply clamping force on the electronic equipment 106 in a top-to-bottom direction, while pushing a top clamp 216 causes the top clamp 216 to move away from the electronic equipment 106. As shown in FIG. 5 and described below, one or more pins and one or more angled cam slots could be used to cause the downward movement of a top clamp 216 as the top clamp 216 is pulled by the associated threaded rod 212.

The threaded rods 212 are used to apply forward or backward force on the side and top clamps 214 and 216. The threaded rods 212 therefore represent hardware "pulls" that are used to pull on and move the side and top clamps 214 and 216. When a locking nut or other connector is placed over the end of each threaded rod 212, the connector can be tightened to a specified torque value. The torque values on the locking nuts or other connectors translate into clamping loads applied to the electronic equipment 106 by the clamps 214 and 216. As a result, this allows the amount of clamping force applied by each side and top clamp 214 and 216 to be controlled as needed or desired. This also allows reduced or minimal force (torqueing of the locking nuts or other connectors) to put pressure on the electronic equipment 106. Note that while separate threaded rods 212 are shown here as pulling on individual side and top clamps 214 and 216, this need not be the case. For instance, a single threaded rod 212 could pull on multiple clamps, such as multiple side clamps 214, multiple top clamps 216, or one or more side clamps 214 and one or more top clamps 216.

The number of side clamps 214 and top clamps 216 can vary depending on the implementation. For example, in some embodiments, there are four side clamps 214 and four top clamps 216, two of each on each side of the clamping assembly 108. One side clamp 214 and one top clamp 216 could then be used in conjunction with two threaded rods 212 at each of the four corners of the clamping assembly 108. In other embodiments, there are two side clamps 214 and two top clamps 216. All of the clamps 214-216 could (but need not) be on the same side of the clamping assembly 108, in which case the clamps 214 and 216 could be used in conjunction with two threaded rods 212 at one front corner and one back corner of the clamping assembly 108. In still other embodiments, a single side clamp 214 can be used, such as when the side clamp 214 is mounted on one side rail 202a-202b and the other side rail 202a-202b fixedly secures the equipment 106. Note, however, that these are example arrangements of the side clamps 214 and top clamps 216 and that any number of each clamp and any arrangement of those clamps could be used. In general, the clamping assembly 108 has at least one side clamp 214 and at least one top clamp 216.

As shown in the example of FIG. 4, the upper threaded rod 212 can include a circular end that receives a projection 402 from a top clamp 216, and the lower threaded rod 212 can include a circular end that receives part of a projection 404 from a side clamp 214. In this arrangement, the upper threaded rod 212 can rotate in a vertical plane, while the lower threaded rod 212 can rotate in a horizontal plane (at least in the orientation of the device shown in FIG. 4). This allows the threaded rods 212 to be moved in order to position the threaded rods 212, such as through holes of the mounting brackets 208 or faceplate 210. Note, however, that other arrangements could also be used, such as when the projections 402 and 404 are reversed on the clamps 214 and 216, both clamps 214 and 216 include a projection 402, or both clamps 214 and 216 include a projection 404. Other mechanisms could also be used to attach the threaded rods 212 to the side and top clamps 214 and 216.

Figure 2B:
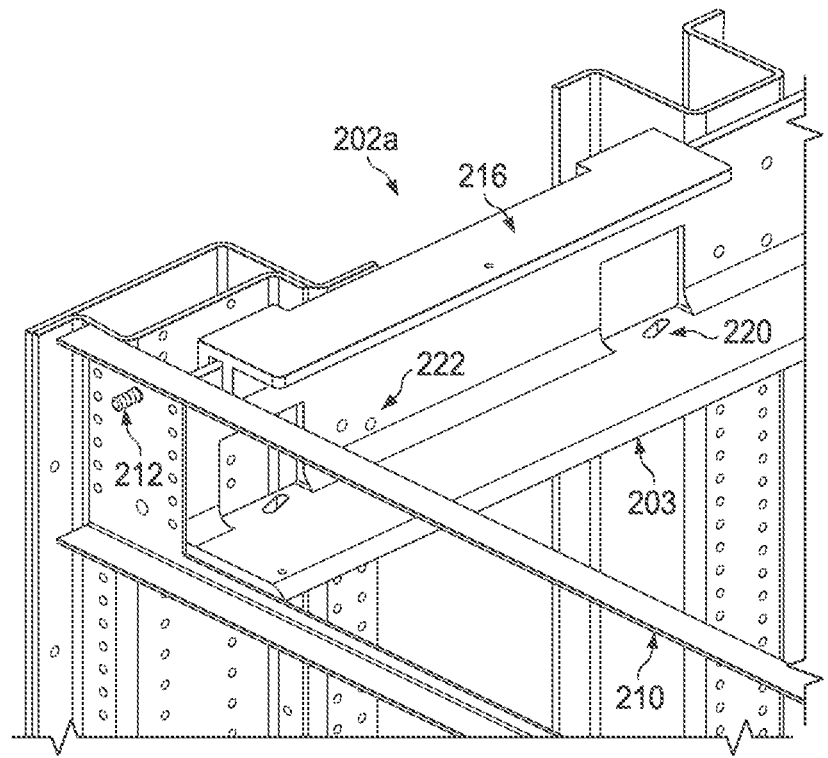

As can be seen in FIGS. 2A, 2B, and 3, the side rails 202a-202b may include a number of holes 222, which can align with holes in various rails 104 or rail flanges 224 of the cabinet 102. Bolts or other connectors could be inserted through the holes of the rails 104 and through the holes 222 to couple the side rails 202a-202b of the clamping assembly 108 to the rails 104 of the cabinet 102. If desired, the bolts or other connectors could also extend into and be coupled to the electronic equipment 106 placed in the clamping assembly 108.

FIG. 5 illustrates a portion of another clamping assembly 108 that is similar to the design shown in FIGS. 2A through 4. As shown in FIG. 5, this embodiment of the clamping assembly 108 includes a side rail 502 with a flange 503. In some embodiments, another side rail 502 with the same or similar structure is positioned on the opposite side of a piece of electronic equipment 106. At least one side clamp 504 and at least one top clamp 506 can be used in conjunction with each side rail 502.

The side clamp 504 here is at least partially insertable into a slot 505 of the flange 503. Pins 508 are inserted through holes of the flange 503 and through cam slots 510 of the side clamp 504. In this example, there are two pins 508 that extend through two cam slots 510 of the side clamp 504, although other numbers of pins and cam slots could be used. The cam slots 510 are angled inward as the cam slots 510 extend towards the closer end of the clamping assembly 108. Thus, movement of the side clamp 504 towards the closer end of the clamping assembly 108 causes the side clamp 504 to move inward and apply clamping force on the electronic equipment 106 in a side-to-side direction. Various angles that are not parallel or perpendicular to the long axis of the side rail 502 could be used here. In some embodiments, the cam slots 510 are angled between 16° and 18° with respect to the long axis of the side rail 502, although other angles could be used.

Pins 512 are also inserted through holes of the top clamp 506 and into cam slots 514 of the side rail 502 (note that the same arrangement could be used in FIGS. 2A through 4). In this example, there are two pins 512 that extend through two cam slots 514 of the side rail 502, although other numbers of pins and cam slots could be used. The cam slots 514 are angled downward as the cam slots 514 extend towards the closer end of the clamping assembly 108. Thus, movement of the top clamp 506 towards the closer end of the clamping assembly 108 causes the top clamp 506 to move downward and apply clamping force on the electronic equipment 106 in a top-to-bottom direction. Various angles that are not parallel or perpendicular to the long axis of the side rail 502 could be used here. In some embodiments, the cam slots 514 are angled between 16° and 18° with respect to the long axis of the side rail 502, although other angles could be used.

Threaded rods 516 are coupled to the side and top clamps 504 and 506 and are used as hardware pulls to move the side and top clamps 504 and 506. Locking nuts 518 or other connectors can be placed on ends of the threaded rods 516 and tightened to secure the clamping assembly 108 to a cabinet 102 or other support structure. While the arrangement of the threaded rods 516 shown in FIG. 5 is the same as that described above with respect to FIG. 4, the various modifications discussed with respect to FIG. 4 could also be used in FIG. 5.

In the embodiments of the clamping assemblies 108 shown in FIGS. 2A through 5, the clamping assemblies 108 provide various clamping forces to help secure electronic equipment 106 in the clamping assemblies 108. The clamping forces can also be tailored as needed or desired, such as based on the electronic equipment 106 being used in a clamping assembly 108. For example, any of the following forces can be used and tailored as desired. At least one side-to-side clamping force can be created using one or more side clamps 214 or 504. At least one top-to-bottom clamping force can be created using one or more top clamps 216 or 506. The top plate(s) 204 and/or bottom plate(s) 206 (which could be used in any of the clamping assemblies described here) can provide continuous support side-to-side. The mounting brackets 208 (front and/or rear) and/or the faceplate 210 (either or both of which could also be used in any of the clamping assemblies described here) can provide additional support as needed.

As noted above, the clamping assemblies 108 described in this patent document help to more effectively secure electronic equipment 106 or other components in cabinets 102 or other support structures. Moreover, because the cam slots (such as those shown in FIGS. 2B and 5) are angled with respect to movement of the electronic equipment 106 or other components front-to-back or back-to-front, the cam slots help to reduce or prevent back-driving of the electronic equipment 106 or other components, which could otherwise loosen the electronic equipment 106 or other components.

Although FIGS. 2A through 5 illustrate examples of clamping assemblies 108 for use with electronic equipment, various changes may be made to FIGS. 2A through 5. For example, the sizes, shapes, and relative dimensions of the various components in the clamping assemblies 108 are for illustration only and can be modified as needed or desired. As noted above, for instance, different clamping assemblies 108 could be designed to secure equipment 106 of different heights. Also, any features shown in one or more of these figures could be used in the other figures, such as when one or more top plates 204, one or more bottom plates 206, one or more mounting brackets 208, or a faceplate 210 are used in FIG. 5. Further, the cam slots and the pins could be reversed such that a structure having a pin could include a cam slot and a structure having a cam slot could include a pin. In addition, various directional terms (such as top, bottom, side, front, and back) are used above for convenience only and are made with reference to the particular orientations shown in FIGS. 2A through 5. However, this does not limit how the clamping assemblies 108 can be used, and the clamping assemblies 108 could be used in any suitable orientations.

Figure 6:
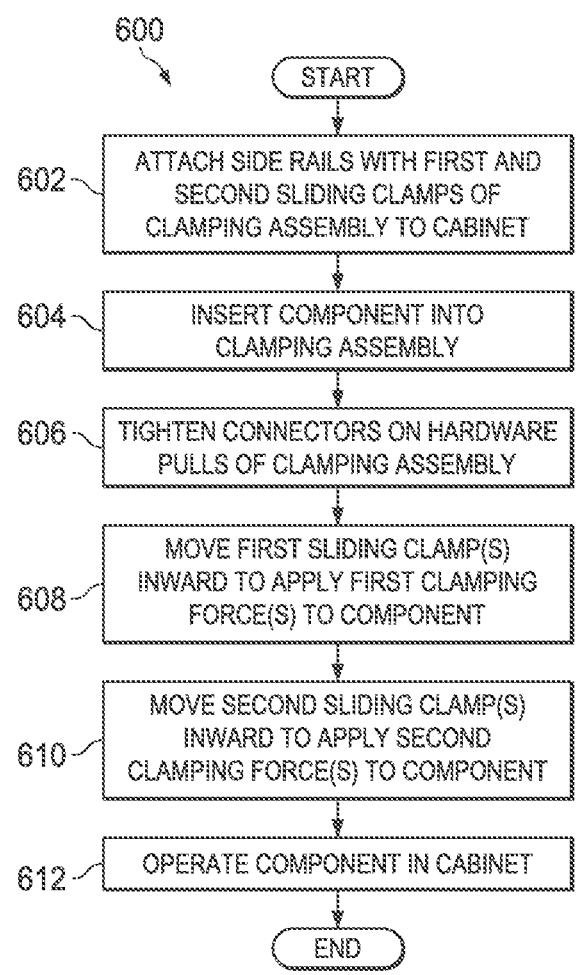
FIG. 6 illustrates an example method for mounting electronic equipment using a clamping assembly according to this disclosure.

FIG. 6 illustrates an example method 600 for mounting electronic equipment using a clamping assembly according to this disclosure. For ease of explanation, the method 600 is described with respect to the clamping assemblies 108 of FIGS. 2A through 5 being used in the system 100 of FIG. 1. However, the method 600 could be used with any other suitable clamping assemblies and in any other suitable system.

As shown in FIG. 6, side rails (optionally with one or more first sliding clamps and one or more second sliding clamps) of a clamping assembly are attached to a cabinet at step 602. This could include, for example, attaching the side rails 202a-202b, 502 to a cabinet 102. The side rails 202a-202b, 502 could be attached to the cabinet 102 in various ways. For instance, the threaded rods 212, 516 of the side rails 202a-202b, 502 could be inserted through holes of mounting brackets 208 or a faceplate 210, and locking nuts 518 or other connectors could be loosely placed on ends of the threaded rods 212, 516 to hold the clamping assembly 108 on the cabinet 102. Also or alternatively, bolts or other connectors could be inserted through the holes of the rails 104 or rail flanges 224 and through the holes 222 of the side rails 202a-202b, 502 to hold the side rails on the cabinet 102. Note that the first and second sliding clamps could be mounted on the side rails 202a-202b, 502 when the side rails are attached to the cabinet, or the first and second sliding clamps could be mounted on the side rails 202a-202b, 502 after the side rails have been attached to the cabinet.

A component is inserted into the clamping assembly at step 604. This could include, for example, personnel sliding electronic equipment 106 between the side rails 202a-202b, 502 of the clamping assembly 108. This could also include the personnel positioning the electronic equipment 106 so that the electronic equipment 106 sits on the flanges 203, 503 of the side rails 202a-202b, 502.

Connectors are tightened onto hardware pulls of the clamping assembly at step 606. This could include, for example, the personnel tightening the locking nuts 518 or other connectors onto the ends of the threaded rods 212, 516 of the clamping assembly 108. In some embodiments, the locking nuts 518 or other connectors can be tightened to one or more specified torque values.

The tightening of the connectors on the hardware pulls causes the one or more first sliding clamps to move inward and apply one or more first clamping forces on the component at step 608. The tightening of the connectors on the hardware pulls also causes the one or more second sliding clamps to move inward and apply one or more second clamping forces on the component at step 610. This may include, for example, the threaded rods 212, 516 pulling one or more side clamps 214, 504 towards one or more ends of the clamping assembly 108. This may also include the threaded rods 212, 516 pulling one or more top clamps 216, 506 towards one or more ends of the clamping assembly 108. Pins 218, 508, 512 in the clamping assembly 108 can travel along angled cam slots 220, 510, 514 in order to move the side clamp(s) 214, 504 and top clamp(s) 216, 506 inward and downward towards the electronic equipment 106. As noted earlier, any number of side and top clamps could be used here.

Once secured, other steps could occur in order to allow the component to operate within the cabinet at step 612. This could include, for example, attaching electrical, optical, or other cables to the electronic equipment 106 and providing operating power to the electronic equipment 106. Once secured using the clamping assembly 108, various shock or vibration loads can be applied to the electronic equipment 106, and the clamping assembly 108 helps to secure the electronic equipment 106 in the cabinet 102.

Although FIG. 6 illustrates one example of a method 600 for mounting electronic equipment using a clamping assembly, various changes may be made to FIG. 6. For example, while shown as a series of steps, various steps in FIG. 6 could overlap, occur in parallel, occur in a different order, or occur any number of times. As a particular example, the electronic equipment 106 could be inserted into the clamping assembly 108 before the clamping assembly 108 is attached to the cabinet 102. As another example, steps 606-610 generally overlap with one another since the tightening of the connectors on the hardware pulls moves the sliding clamps to create the clamping forces.

Note that the clamping assemblies 108 are often described above as being used to mount electronic equipment 106 in or to a cabinet 102. However, the clamping assemblies 108 described in this patent document could generally be used to secure any suitable components to any suitable support structures.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims is intended to invoke 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the scope of this disclosure, as defined by the following claims.

What is claimed is:

1. An apparatus comprising:
a clamping assembly configured to secure a component in or to a support structure, the clamping assembly comprising:
a first side rail configured to be coupled to the support structure; and
first and second clamps each configured to slide along the first side rail, the first and second clamps configured to apply first and second clamping forces to the component in different directions from one another.

2. The apparatus of claim 1, wherein the clamping assembly further comprises:
a second side rail configured to be coupled to the support structure; and
third and fourth clamps each configured to slide along the second side rail, the third and fourth clamps configured to apply third and fourth clamping forces to the component in different directions from one another.

3. The apparatus of claim 2, wherein:
the clamping assembly comprises multiple first clamps and multiple second clamps configured to slide along the first side rail; and
the clamping assembly comprises multiple third clamps and multiple fourth clamps configured to slide along the second side rail.

4. The apparatus of claim 1, wherein:
each of the first and second clamps comprises at least one pin configured to slide along at least one cam slot in the first side rail; and
each cam slot is at an angle that is not parallel and not perpendicular with respect to a long axis of the first side rail.

5. The apparatus of claim 1, wherein:
the first clamp comprises at least one first pin configured to slide along at least one first cam slot in the first side rail;
the second clamp comprises at least one second cam slot configured to receive at least one second pin inserted through the first side rail; and
each of the first and second cam slots is at an angle that is not parallel and not perpendicular with respect to a long axis of the first side rail.

6. The apparatus of claim 1, wherein each of the first and second clamps comprises a hardware pull configured to move the associated first or second clamp toward an end of the clamping assembly.

7. The apparatus of claim 6, wherein each hardware pull comprises a threaded rod configured to receive a locking nut.

8. The apparatus of claim 2, further comprising:
a plate connecting the first and second side rails.

9. The apparatus of claim 2, further comprising:
a faceplate at an end of the first side rail and an end of the second side rail, the faceplate configured to be connected to the support structure.

10. The apparatus of claim 1, further comprising:
one or more mounting brackets each configured to connect the first side rail to the support structure.

11. A system comprising:
a cabinet; and
a clamping assembly configured to secure a piece of equipment in or to the cabinet, the clamping assembly comprising:
a first side rail configured to be coupled to the cabinet; and
first and second clamps each configured to slide along the first side rail, the first and second clamps configured to apply first and second clamping forces to the piece of equipment in different directions from one another.

12. The system of claim 11, wherein the clamping assembly further comprises:
a second side rail configured to be coupled to the cabinet; and
third and fourth clamps each configured to slide along the second side rail, the third and fourth clamps configured to apply third and fourth clamping forces to the piece of equipment in different directions from one another.

13. The system of claim 12, wherein:
the clamping assembly comprises multiple first clamps and multiple second clamps configured to slide along the first side rail; and
the clamping assembly comprises multiple third clamps and multiple fourth clamps configured to slide along the second side rail.

14. The system of claim 11, wherein:
each of the first and second clamps comprises at least one pin configured to slide along at least one cam slot in the first side rail; and
each cam slot is at an angle that is not parallel and not perpendicular with respect to a long axis of the first side rail.

15. The system of claim 11, wherein:
the first clamp comprises at least one first pin configured to slide along at least one first cam slot in the first side rail;
the second clamp comprises at least one second cam slot configured to receive at least one second pin inserted through the first side rail; and
each of the first and second cam slots is at an angle that is not parallel and not perpendicular with respect to a long axis of the first side rail.

16. The system of claim 11, wherein each of the first and second clamps comprises a hardware pull configured to move the associated first or second clamp toward an end of the clamping assembly.

17. The system of claim 16, wherein each hardware pull comprises a threaded rod configured to receive a locking nut.

18. The system of claim 11, wherein:
the system comprises multiple clamping assemblies configured to secure multiple pieces of equipment in or to the cabinet; and
each of the clamping assemblies comprises the first side rail and the first and second clamps.

19. The system of claim 11, wherein:
the first clamp is configured to apply the first clamping force to the piece of equipment in a side-to-side direction; and
the second clamp is configured to apply the second clamping force to the piece of equipment in a top-to-bottom direction.

20. A method comprising:
coupling a side rail of a clamping assembly to a support structure;
sliding first and second clamps along the side rail; and
applying first and second clamping forces to a component in different directions from one another as the first and second clamps move slide along the side rail.

* * * * *